United States Patent
Zhao et al.

(10) Patent No.: US 10,297,696 B2
(45) Date of Patent: May 21, 2019

(54) SCHOTTKY DIODE INCLUDING AN INSULATING SUBSTRATE AND A SCHOTTKY DIODE UNIT AND METHOD FOR MAKING THE SAME

(71) Applicants: Tsinghua University, Beijing (CN); HON HAI PRECISION INDUSTRY CO., LTD., New Taipei (TW)

(72) Inventors: Yu-Dan Zhao, Beijing (CN); Xiao-Yang Xiao, Beijing (CN); Ying-Cheng Wang, Beijing (CN); Yuan-Hao Jin, Beijing (CN); Tian-Fu Zhang, Beijing (CN); Qun-Qing Li, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/846,222

(22) Filed: Dec. 19, 2017

(65) Prior Publication Data
US 2018/0212069 A1    Jul. 26, 2018

(30) Foreign Application Priority Data
Jan. 20, 2017    (CN) .......................... 2017 1 0051536

(51) Int. Cl.
*H01L 29/47*    (2006.01)
*H01L 51/00*    (2006.01)
(Continued)

(52) U.S. Cl.
CPC ............ *H01L 29/872* (2013.01); *B82Y 10/00* (2013.01); *H01L 21/28* (2013.01); *H01L 29/04* (2013.01);
(Continued)

(58) Field of Classification Search
CPC ..... H01L 29/47; H01L 29/04; H01L 29/0673; H01L 29/16; H01L 29/1608; H01L 29/20;
(Continued)

(56) References Cited

U.S. PATENT DOCUMENTS

2006/0261433 A1* 11/2006 Manohara ............ B82Y 10/00 257/471
2009/0072223 A1* 3/2009 Awano .................. B82Y 10/00 257/24

(Continued)

FOREIGN PATENT DOCUMENTS

TW    201440228 A    10/2014
TW    201503266 A    1/2015

*Primary Examiner* — Didarul A Mazumder
(74) *Attorney, Agent, or Firm* — ScienBiziP, P.C.

(57) ABSTRACT

A Schottky diode includes an insulating substrate and at least one Schottky diode unit. The at least one Schottky diode unit is located on a surface of the insulating substrate. The at least one Schottky diode unit includes a first electrode, a semiconductor structure and a second electrode. The semiconductor structure comprising a first end and a second end. The first end is laid on the first electrode, the second end is located on the surface of the insulating substrate. The semiconducting structure is nano-scale semiconductor structure. The second electrode is located on the second end.

11 Claims, 18 Drawing Sheets

(51) Int. Cl.
*H01L 29/00* (2006.01)
*H01L 29/87* (2006.01)
*H01L 29/16* (2006.01)
*H01L 29/66* (2006.01)
*H01L 51/05* (2006.01)
*H01L 29/872* (2006.01)
*H01L 29/24* (2006.01)
*H01L 29/20* (2006.01)
*H01L 29/04* (2006.01)
*H01L 21/28* (2006.01)
*H01L 29/06* (2006.01)
*B82Y 10/00* (2011.01)
*H01L 29/49* (2006.01)
*H01L 29/786* (2006.01)
*H01L 29/775* (2006.01)

(52) U.S. Cl.
CPC .......... *H01L 29/0673* (2013.01); *H01L 29/16* (2013.01); *H01L 29/1608* (2013.01); *H01L 29/20* (2013.01); *H01L 29/24* (2013.01); *H01L 29/66143* (2013.01); *H01L 29/66969* (2013.01); *H01L 51/0048* (2013.01); *H01L 51/0053* (2013.01); *H01L 51/0579* (2013.01); *H01L 29/47* (2013.01); *H01L 29/495* (2013.01); *H01L 29/4908* (2013.01); *H01L 29/775* (2013.01); *H01L 29/78696* (2013.01)

(58) Field of Classification Search
CPC ... H01L 29/24; H01L 29/4908; H01L 29/495; H01L 29/78696; H01L 29/872; H01L 51/0053; H01L 51/0558; H01L 2924/12032; H01L 29/7806; H01L 29/782; H01L 29/66143; H01L 29/66212
USPC .......................................................... 257/27
See application file for complete search history.

(56) References Cited

U.S. PATENT DOCUMENTS

| | | | |
|---|---|---|---|
| 2009/0225578 A1* | 9/2009 | Kitabatake | H01L 29/0696 363/132 |
| 2011/0297962 A1* | 12/2011 | Hwang | H01L 29/1602 257/77 |
| 2014/0306175 A1 | 10/2014 | Qian et al. | |
| 2015/0116906 A1* | 4/2015 | Thevasahayam | H01G 11/28 361/502 |

* cited by examiner

SCHOTTKY DIODE INCLUDING AN INSULATING SUBSTRATE AND A SCHOTTKY DIODE UNIT AND METHOD FOR MAKING THE SAME

CROSS-REFERENCE TO RELATED APPLICATIONS

This application claims all benefits accruing under 35 U.S.C. § 119 from China Patent Application No. 201710051536.X, filed on Jan. 20, 2017, in the China Intellectual Property Office, the contents of which are hereby incorporated by reference.

FIELD

The present disclosure relates to a Schottky diode and a method for making the same.

BACKGROUND

A Schottky diode has low power, high current and super high speed, therefore, it can be applied in various of electronic devices. The Schottky diode generally includes a noble metal and a semiconductor layer contacted with the noble metal. A barrier having a rectifying property is formed in an interface between the noble metal and the semiconductor layer.

For low-dimensional nano-electronic materials, unlike traditional silicon materials, it is difficult to prepare diodes by doping method. The conventional nano-semiconductor diode material is mainly obtained by chemical doping or heterojunction, the preparation process is complex, and the application of the diode is limited.

BRIEF DESCRIPTION OF THE DRAWINGS

Implementations of the present technology will now be described, by way of example only, with reference to the attached figures, wherein.

DETAILED DESCRIPTION

Figure 1:
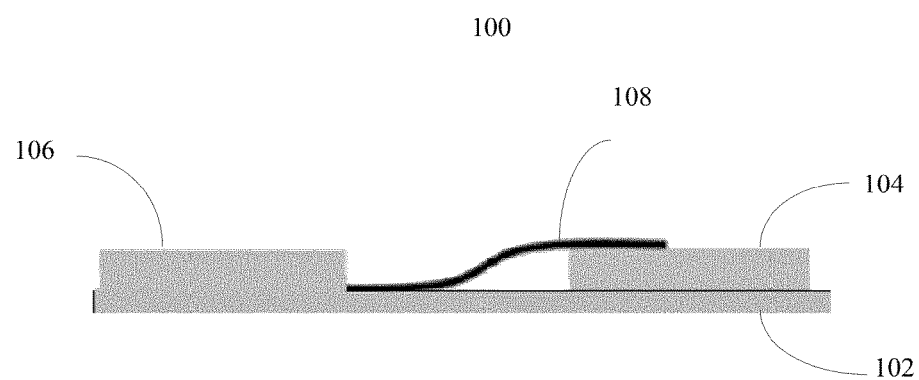
FIG. 1 is a structure schematic side view of a first embodiment of a Schottky diode.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "include," when utilized, means "include, but not necessarily limited to"; it specifically indicates open-ended inclusion or membership in the so-described combination, group, series, and the like.

Figure 2:
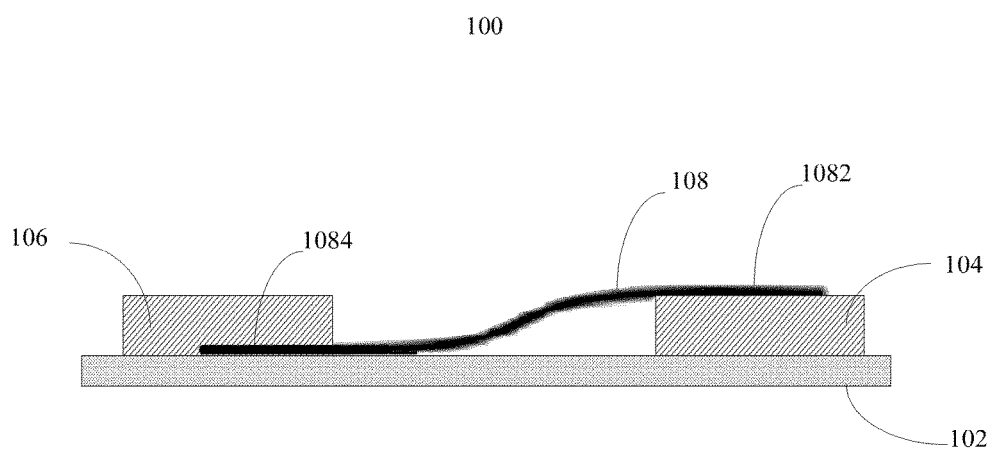
FIG. 2 is a side structure sectional view of the Schottky diode in FIG. 1.

Referring to FIGS. 1-2, one embodiment is described in relation to a Schottky diode 100. The Schottky diode 100 includes an insulating substrate 102 and a Schottky diode unit (not labeled). The Schottky diode unit is disposed on a surface of the insulating substrate 102 and supported by the insulating substrate 102. The Schottky diode unit includes a first electrode 104, a semiconductor structure 108, and a second electrode 106. The first electrode 104 is disposed on the surface of the insulating substrate 102. The semiconductor structure 108 includes a first end 1082 and a second end 1084 opposite to the first end 1082. The first end 1082 of the semiconductor structure 108 is laid on the first electrode 104, and the first electrode 104 is located between the first end 1082 of the semiconductor structure 108 and the insulating substrate 102. The second end 1084 is disposed on the surface of the insulating substrate 102, and the second electrode 106 is disposed on the semiconductor structure 108, and the second end 1084 of the semiconductor structure 108 is located between the second electrode 106 and the insulating substrate 102.

Figure 3:
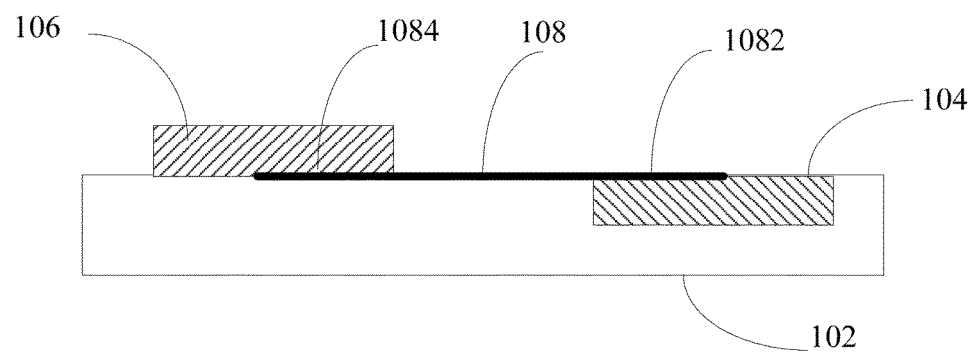
FIG. 3 is a side structure sectional view of a Schottky diode in another example.

Referring to FIG. 3, in one embodiment, the structure of the Schottky diode 100 can be shown in FIG. 3. The first electrode 104 is embedded in the insulating substrate 102, and an upper surface of the first electrode 104 is flush with the surface of the insulating substrate 102. The semiconductor structure 108 is horizontally disposed on the surface of the insulating substrate 102. The first end 1082 is located on the upper surface of the first electrode 104. The second electrode 106 is disposed on the surface of the semiconductor structure 108 to cover the second end 1084 of the semiconductor structure 108. The first electrode 104 is located between the first end 1082 of the semiconductor structure 108 and the insulating substrate 102. The second end 1084 of the semiconductor structure 108 is between the second electrode 106 and the insulating substrate 102.

Figure 4:
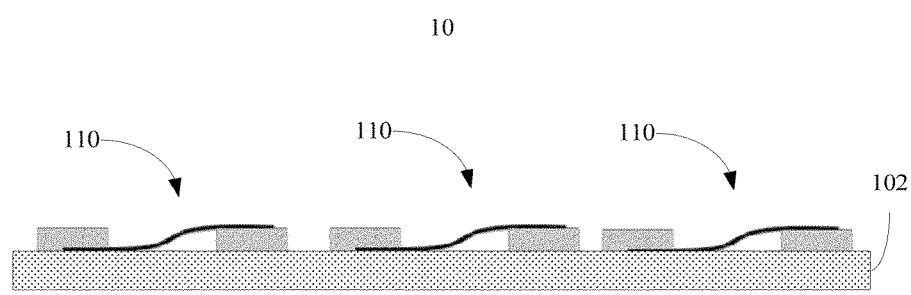
FIG. 4 is a structure schematic side view of one embodiment of a Schottky diode array.

Referring to FIG. 4, the present invention further provides a Schottky diode array 10 according to one embodiment. The Schottky diode array 10 includes the insulating substrate 102 and a plurality of Schottky diode units 110 disposed on the surface of the insulating substrate 102. The plurality of Schottky diode units 110 are arranged in an array on the surface of the insulating substrate 102. Each Schottky diode unit 110 is spaced apart from each other. The Schottky diode unit 110 is the same as the Schottky diode unit described in the first embodiment.

According to one embodiment, the Schottky diode 100 can be obtained by a method of: forming the first electrode 104 on the insulating substrate 102; forming the semiconductor structure 108 on the first electrode 104 and the insulating substrate 102, that is, the first end 1082 of the semiconductor structure 108 is disposed on the upper surface of the first electrode 104, and the second end 1084 is disposed on the surface of the insulating substrate 102; forming the second electrode 106 is on the upper surface of the second end 1084 of the semiconductor structure 108. In this embodiment, both the first electrode 104 and the second electrode 106 are formed by photolithography method.

According to one embodiment, the Schottky diode array 10 is obtained by method of: forming a plurality of first electrodes 104 on the insulating substrate 102; forming a plurality of semiconductor structures 108 on the first electrodes 104 and the insulating substrate 102, the plurality of semiconductor structures 108 and the plurality of first electrodes 104 are arranged in a one-by-one manner, that is, the first end 1082 of each semiconductor structure 108 is disposed on the upper surface of one of the first electrodes 104 and the second end 1084 is disposed on the surface of the insulating substrate 102; forming the second electrode 106 above the second end 1084 of the semiconductor structure 108, the semiconductor structure 108 and the second electrode 106 are arranged in a one-by-one manner, thereby a plurality of second electrodes 106 are formed. Each second electrode 106 is disposed above the second end 1084 of one of the semiconductor structures 108, the second end 1084 is located between one second electrode 106 and the insulating substrate 102. The plurality of first electrodes 104 and the plurality of second electrodes 106 are formed by photolithography.

The insulating substrate 102 is used to support Schottky diode 100 or the Schottky diode array 10. A material of the insulating base 102 is selected from hard materials and flexible materials. The hard material can be glass, quartz, ceramic, diamond, or silicon. The flexible material can be plastic or resin. In this embodiment, the material of the insulating substrate 102 is a silicon wafer with a silicon dioxide layer. The insulating substrate 102 can also be a Large scale integrated circuit board, and the plurality of Schottky diodes 100 may be integrated on one insulating substrate 102 according to a predetermined pattern to form a thin film transistor or other semiconductor device.

A material of the first electrode 104 or the second electrode 106 can be aluminum, copper, tungsten, molybdenum, gold, titanium, neodymium, palladium, cesium or alloys thereof. In this embodiment, the material of the first electrode 104 and the second electrode 106 is a palladium film, which has a thickness of about 50 nanometers.

Figure 5:
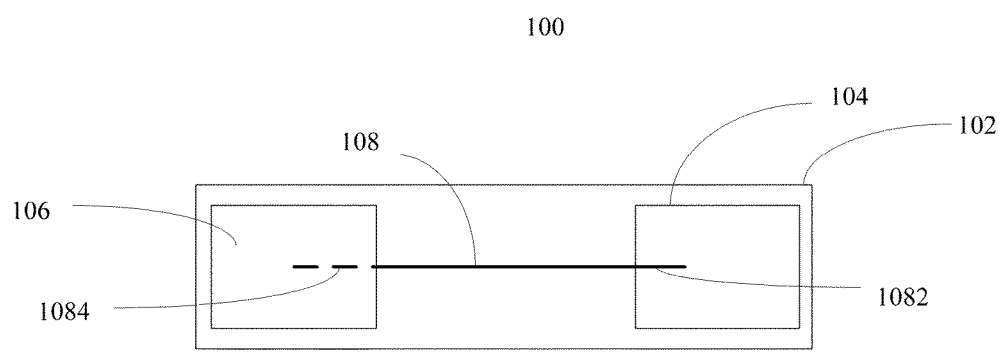
FIG. 5 is a structure schematic top view of one embodiment of a Schottky diode, in which a one-dimensional nano-material is used as a semiconductor structure.
Figure 6:
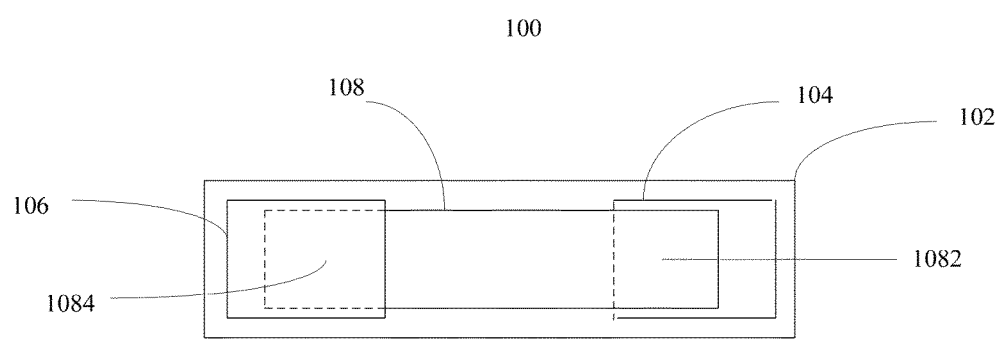
FIG. 6 is a structure schematic top view of one embodiment of a Schottky diode, in which a two-dimensional nano-material is used as a semiconductor structure.

In some embodiments, the semiconductor structure 108 is a nano-scale semiconductor structure. The nano-scale semiconductor structure may be a one-dimensional nano-structure, that is, a linear structure with a diameter less than 200 nanometers as shown in FIG. 5. In another example, the nano-scale semiconductor structure may also be a two-dimensional nano-structure, that is a film-like structure with a thickness less than 200 nanometers, as shown in FIG. 6. A material of the semiconductor structure 108 can be an N-type semiconductor or a P-type semiconductor. The material of the semiconductor structure 108 is not limited, and can be an inorganic compound semiconductor, an elemental semiconductor or an organic semiconductor material. In detail, the material of the semiconductor structure 108 can be gallium arsenide, silicon carbide, polysilicon, monocrystalline silicon or naphthalene. The one-dimensional nanostructure can be nanowire, nanotube or nanorod, such as carbon nanotube and silicon nanowire. When the semiconductor structure 108 is a one-dimensional nanostructure, the semiconductor structure 108 extends from the first electrode 104 to the second electrode 106. The two-dimensional nano-structure can be nanofilm, such as carbon nanotube film, molybdenum disulfide film or the like. In some embodiments, the material of the semiconductor structure 108 is a transition metal sulfide material. In this embodiment, the material of the semiconductor structure 108 is molybdenum sulfide ($MoS_2$), which is an N-type semiconductor material and has a thickness ranged from 1 nanometer (nm) to 2 nm.

The semiconductor structure 108 can be a carbon nanotube structure. The carbon nanotube structure can be a single semiconducting carbon nanotube or a carbon nanotube film. A thickness of the carbon nanotube film is less than or equal to 200 nanometers.

In one embodiment, the semiconductor structure 108 is a single semiconducting carbon nanotube, as shown in FIG. 5. The semiconducting carbon nanotube can have a diameter ranged from about 1 nm to 10 nm. In some embodiment, the semiconducting carbon nanotube is a single-walled carbon nanotube having a diameter ranged from 1 nm to 5 nm, and a length ranged from 100 nm to 1 μm. The semiconducting carbon nanotube extends from the first electrode 104 to the second electrode 106. One end of the semiconducting carbon nanotube is disposed on the first electrode 104, and the other end of the semiconducting carbon nanotube is disposed under the second electrode 106.

In other embodiments, the semiconductor structure 108 is a carbon nanotube film including a plurality of carbon nanotubes. In the plurality of carbon nanotubes, a mass percent of semiconducting carbon nanotubes is ranged from about 80% to about 100%. The semiconductor structure 108 can insist of the plurality of carbon nanotubes. The carbon nanotube film can be an ordered carbon nanotube film or a disordered carbon nanotube film. In the ordered carbon nanotube film, the plurality of carbon nanotubes in the carbon nanotube film are arranged orderly. In the disordered carbon nanotube film, the plurality of carbon nanotubes are arranged disorderly.

Figure 7:
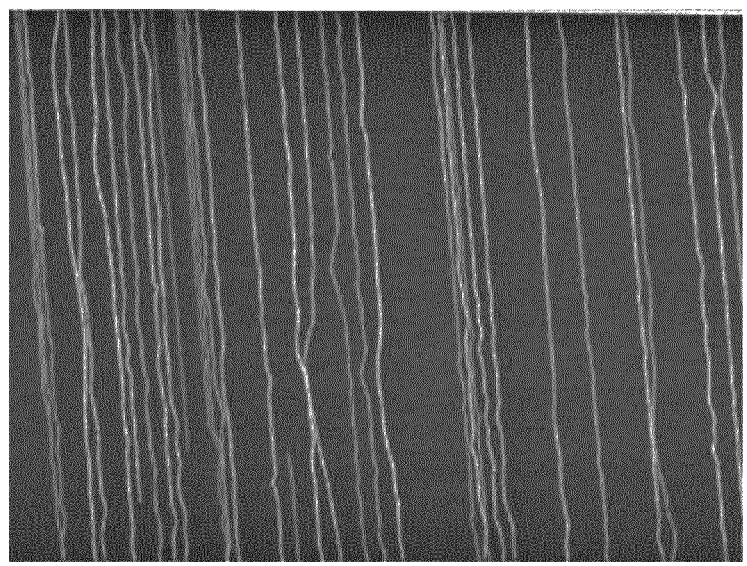
FIG. 7 is a Scanning electron micrograph (SEM) image of a carbon nanotube array film according to one embodiment.
Figure 8:
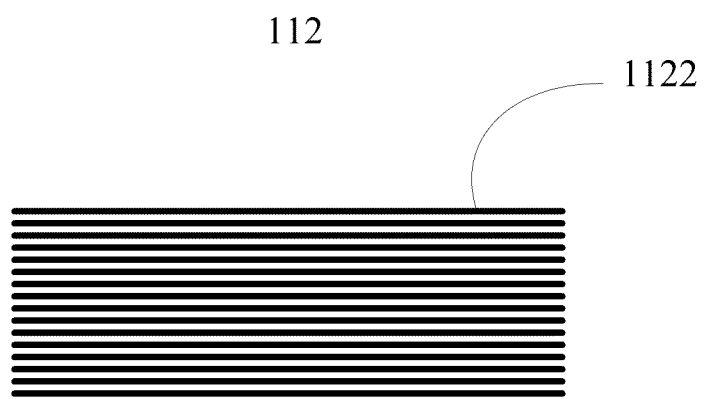
FIG. 8 is a structure schematic view of the carbon nanotube horizontal array film in FIG. 7.

Referring to FIG. 7 and FIG. 8, in one embodiment, the ordered carbon nanotube film 112 is a carbon nanotube horizontal array film including a plurality of carbon nanotubes 1122 arranged substantially parallel to each other and horizontally arranged. The plurality of carbon nanotubes 1122 are parallel to the surface of the insulating substrate 102 and extends from the first electrode 104 to the second electrode 106. The ordered carbon nanotube film 112 is directly grown by a CVD method or transferred from a carbon nanotube array to a target substrate to form a plurality of carbon nanotube conductive channels. The ordered carbon nanotube film 112 includes only one single carbon nanotube 1122 in the thickness direction. That is, a thickness of the ordered carbon nanotube film 112 is the same as a diameter of one carbon nanotube 1122. The carbon nanotube 1122 can have a diameter ranged from 1 nm to 10 nm. The ordered carbon nanotube film 112 has a thickness ranged from 1 nm to 10 nm. In some embodiments, the carbon nanotube 1122 is single-walled carbon nanotube having a diameter ranged from 1 nm to 5 nm, and a length of 100 nm to 1 μm.

Figure 9:
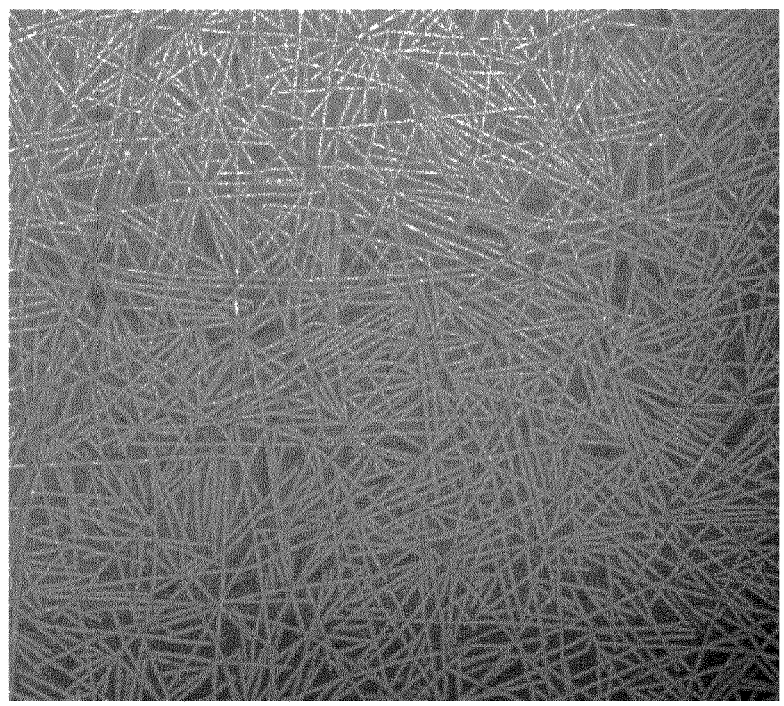
FIG. 9 is an SEM image of a carbon nanotube network according to one embodiment.

Referring to FIG. 9, in some embodiments, the disordered carbon nanotube film is a carbon nanotube network. The carbon nanotube network includes a plurality of carbon nanotubes arranged randomly. In the carbon nanotube network, a mass percentage of the semiconducting carbon nanotubes is greater than or equal to 80% and less than or equal to 100%. The carbon nanotube network can only include carbon nanotubes. The plurality of carbon nanotubes are crossed with or be parallel to each other. The plurality of carbon nanotubes are semiconducting carbon nanotubes having a diameter ranged from 1 nm to 50 nm. The carbon nanotube network has a thickness ranged from 1 nm to 100 nm. In some embodiments, the carbon nanotube network can be obtained by solution-immersed carbon nanotubes deposition. The method of depositing and immersing the carbon nanotubes in the solution includes steps of: dispersing carbon nanotube powder in a dispersant, wherein a mass percentage of the semiconducting carbon nanotubes in the carbon nanotube powder is greater than or equal to 80% and less than or equal to 100%, the dispersant is an organic solvent such as NMP, toluene and the like; then a target substrate is immersed into the dispersant to deposit a disordered network of carbon nanotubes, ie, a carbon nanotube network on the surface of the target substrate. In this embodiment, the target substrate is the insulating substrate 102 formed with a first electrode 104. The carbon nanotubes are deposited directly on the surface of the first electrode 104 and the surface of the insulating substrate 102 to form the carbon nanotube film. Then, the second electrode 106 is formed on the other end of the carbon nanotube film far away from the first electrode 104 to obtain a structure as shown in FIG. 1. That is, the carbon nanotube film is the semiconductor structure 108. In another embodiment, the carbon nanotube film can be formed by ink-jet printing. The ink-jet printing carbon nanotube means that the carbon nanotube powder dispersed in the dispersant is prepared into a printing ink, and the printing ink is printed directly on the first electrode 104 and the insulating substrate 102 to get the carbon nanotube film. In this embodiment, the carbon nanotube film is directly printed on the insulating substrate 102 on which the first electrode 104 is formed. In another embodiment, the carbon nanotube film is a disordered network obtained by CVD growth using a metal catalyst and a carbon source. The catalyst metal includes iron, cobalt, nickel and their corresponding alloys, salts and the like. The carbon source includes gases and liquids such as methane, acetylene, carbon monoxide, ethanol and isopropanol.

In one embodiment, the ordered carbon nanotube film can be a drawn carbon nanotube film. The drawn carbon nanotube film is a free standing structure consisting a plurality of carbon nanotubes, wherein a mass percentage of the semiconducting carbon nanotubes in the carbon nanotube powder is greater than or equal to 80% and less than or equal to 100%. The drawn carbon nanotube film includes a number of successive and oriented carbon nanotubes joined end-to-end by van der Waals attractive force therebetween. Each drawn carbon nanotube film includes a number of successively oriented carbon nanotube segments joined end-to-end by van der Waals attractive force therebetween. Each carbon nanotube segment includes a number of carbon nanotubes substantially parallel to each other, and joined by van der Waals attractive force therebetween. Some variations can occur in the drawn carbon nanotube film. The carbon nanotubes in the drawn carbon nanotube film are oriented along a preferred orientation. The drawn carbon nanotube film is a free standing structure means that the drawn carbon nanotube film does not need a large area support, and as long as the opposite sides of the drawn carbon nanotube film are supported, the drawn carbon nanotube film can be dangled as a whole to maintain its own film state, the drawn carbon nanotube film can be hung in the air by using two supporters separately supports its opposite sides. The free standing character of the drawn carbon nanotube film is achieved mainly through the continuous presence of carbon nanotubes joined with each other by van der Waals attractive force therebetween in the drawn carbon nanotube film.

In other embodiments, the carbon nanotube film can be a pressed carbon nanotube film. The pressed carbon nanotube film is a free standing structure including a plurality of carbon nanotubes, wherein a mass percentage of the semiconducting carbon nanotubes in the carbon nanotube powder is greater than or equal to 80% and less than or equal to 100%. The pressed carbon nanotube film is formed by pressing a carbon nanotube array. The carbon nanotubes in the pressed carbon nanotube film are arranged along a same direction or along different directions. The carbon nanotubes in the pressed carbon nanotube film can rest upon each other. Adjacent carbon nanotubes are attracted to each other and are joined by van der Waals attractive force. An angle between a primary alignment direction of the carbon nanotubes and a surface of the pressed carbon nanotube film is about 0 degrees to approximately 15 degrees. The greater the pressure applied, the smaller the angle obtained. In one embodiment, the carbon nanotubes in the pressed carbon nanotube film are arranged along different directions, the carbon nanotube structure can be isotropic. The pressed carbon nanotube film includes a plurality of micro-pores dispersed uniformly, and dimeters of the plurality of micro-pores can be ranged from 1 nm to 0.5 μm.

The Schottky diode 100 provided by the present invention has a special asymmetric structure. That is, the first electrode 104 is located above the semiconductor structure 108 and the second electrode 106 is located below the semiconductor structure 108. No matter the semiconductor structure 108 is a P-type semiconductor or an N-type semiconductor, a Schottky barrier height of the semiconductor structure 108 above the electrode is greater than a Schottky barrier height of the semiconductor structure 108 below the electrode. Therefore, the Schottky diode with asymmetric structure provided by the present invention, due to its special asymmetric structure, can have a good Schottky diodes performance with simple semiconductor materials without complicated chemical doping or Heterojunction methods using more materials. In the present invention, for a P-type Schottky diode using P-type semiconductor structure 108, a current flowing in a direction from the first electrode 104 located above the semiconductor structure 108 to the second electrode 106 located below the semiconductor structure 108 is greater than a current flowing in a direction from the second electrode 106 located below the semiconductor structure 108 to the first electrode 104 above the semiconductor structure 108, as such, when the current flows from the first electrode 104 to the second electrode 106, the Schottky diode 100 is turned on; when the current flows from the second direction 106 to the first electrode 104, the Schottky diode 100 is turned off. For a N-type Schottky diode using N-type semiconductor structure 108, a current flowing in a direction from the second electrode 106 located below the semiconductor structure 108 to the first electrode 104 located above the semiconductor structure 108 is greater than a current flowing in a direction from the first electrode 104 located above the semiconductor structure 108 to the second electrode 106 below the semiconductor structure 108, as such, when the current flows from the second electrode 106 to the first electrode 104, the Schottky diode 100 is turned on; when the current flows from the first direction 104 to the second electrode 106, the Schottky diode 100 is turned off. The above phenomenon is due to the flow of electrons and holes. When the electrons and the holes flows along a same direction, the direction of the current caused by the flowing of electrons is different from the direction of the current caused by the flowing of the holes.

Figure 10:
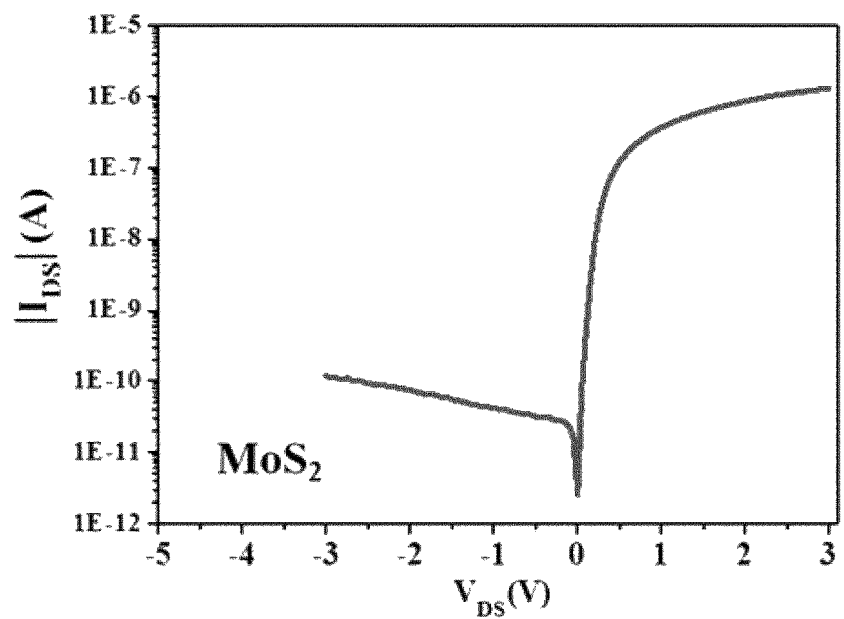
FIG. 10 is a current-voltage graph of a Schottky diode according to one embodiment.

FIG. 10 is a current-voltage graph of a Schottky diode according to one embodiment. In the present embodiment, a molybdenum disulfide ($MoS_2$) nano-film is used as the semiconductor structure 10. As can be seen from FIG. 10, the Schottky diode has a good directivity, the ratio of positive and negative voltage can reach $10^4$.

The Schottky diode provided by the invention has the following advantages: firstly, a Schottky diode with better rectification effect can be obtained by adopting a special asymmetric structure, in which a simple semiconductor material without doping is used, and the ratio of the positive voltage and the negative voltage can reach $10^4$; second, due to the semiconductor structure has a simple structure, the preparation method is easy to do, the cost of Schottky diode is reduced and can be prepared in large-scale.

Figure 11:
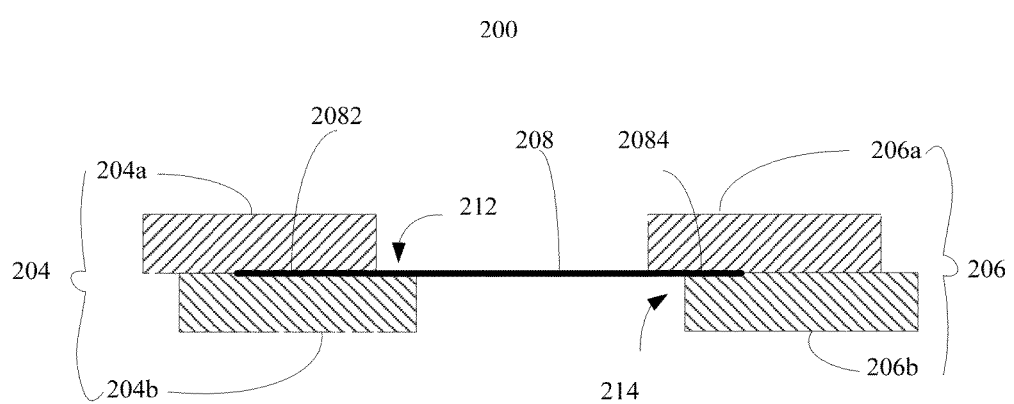
FIG. 11 is a structure schematic sectional view of a second embodiment of a Schottky diode.
Figure 12:
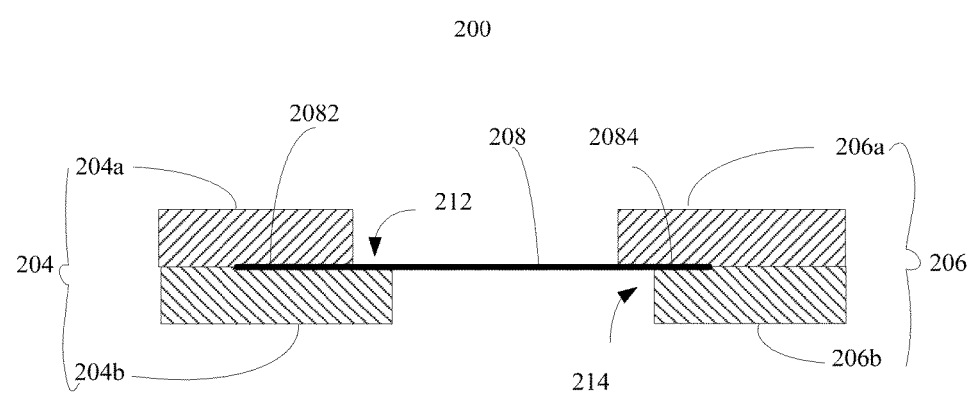
FIG. 12 is a structure schematic sectional view of a second embodiment of a Schottky diode according to one example.
Figure 13:
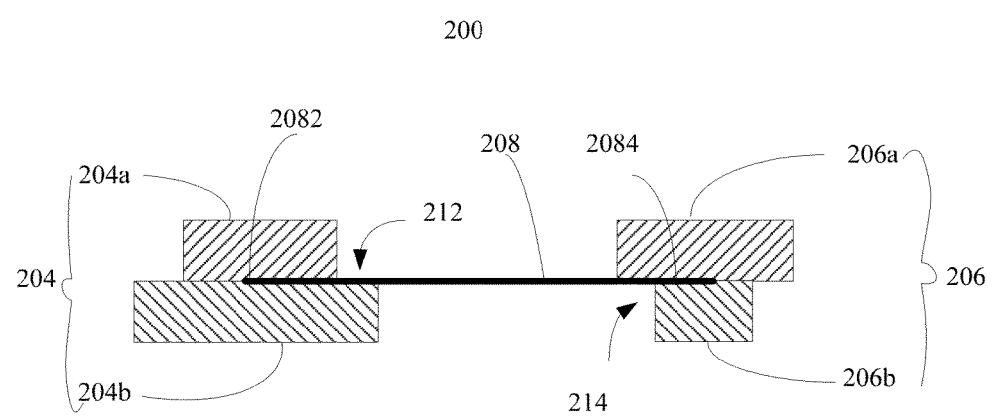
FIG. 13 is a structure schematic sectional view of a second embodiment of a Schottky diode according to another example.

Referring to FIG. 11, FIG. 12 or FIG. 13, according to a second embodiment of the present invention, a Schottky diode 200 is provided. The Schottky diode 200 includes a first electrode 204, a second electrode 206, and a semiconductor structure 208. The semiconductor structure 208 includes a first end 2082 and a second end 2084 opposite to the first end 2082. The first end 2082 of the semiconductor structure 208 contacts with the first electrode 204, and the second end 2084 contacts with and the second electrode 206. The first electrode 204 includes a first metal layer 204a and a second metal layer 204b. The first metal layer 204a covers the second metal layer 204b. One end of the second metal layer 204b is extended from the first metal layer 204a to form a step structure 212 in the first electrode 204. The second electrode 206 includes a third metal layer 206a and a fourth metal layer 206b. The third metal layer 206a covers the fourth metal layer 206b. One end of the third metal layer 206a protrudes from the fourth metal layer 206b to form an inverted step structure 214. The first end 2082 of the semiconductor structure 208 is a portion of the semiconductor structure 208 that is sandwiched by the first metal layer 204a and the second metal layer 204b. The second end 2084 of the semiconductor structure 208 is a portion of the semiconductor structure 208 that is sandwiched by the third metal layer 206a and the fourth metal layer 206b. A portion of the semiconductor structure 108 between the first end 2082 and the second end 2084 is defined as a middle portion (not labeled). The step structure 212 and the inverted step structure 214 are both located between the first end 2082 and the second end 2084 of the semiconductor structure 208, and near the middle portion of the semiconductor structure 208. It can be seen from FIG. 11, FIG. 12 or FIG. 13, the middle portion of the semiconductor structure 208 extends from the step structure 212 of the first electrode 204 to the inverted step structure 214 of the second electrode 206.

Materials of the first electrode 204 and the second electrode 206 are the same as the first electrode 104 and the second electrode 106 in the first embodiment.

Structures and materials of the semiconductor structure 208 are the same as the semiconductor structure 108 in the first embodiment.

Figure 14:
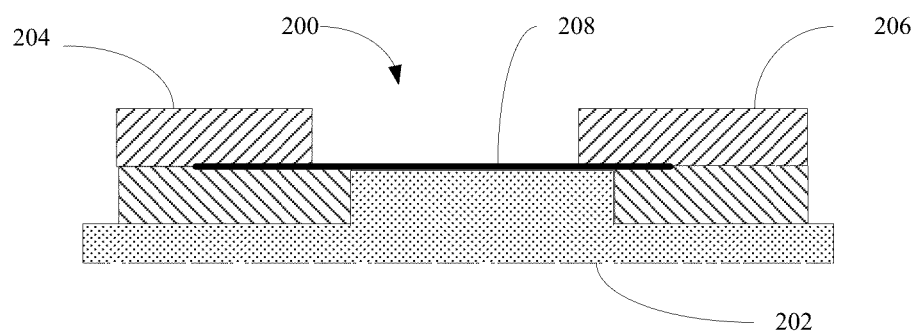
FIG. 14 is a structure schematic sectional view of a second embodiment of a Schottky diode including an insulating substrate.

The Schottky diode 200 can further include an insulating substrate for supporting the first electrode 204, the second electrode 206, and the semiconductor structure 208. The structure of the insulating substrate is not limited, and can be a sheet with a planar surface. The Schottky diode 200 is located on the surface of the insulating substrate. Referring to FIG. 14, the insulating substrate 202 may be a substrate with a grooved structure. The second metal layer 204b of the first electrode 204 and the fourth metal layer 206b of the second electrode 206 are embedded in the insulating substrate 202. Surfaces of the second metal layer 204b, the fourth metal layer 206b, and the insulating substrate 202 are a plane. The semiconductor structure 208 is located on the plane.

Other characteristics of the Schottky diode 200 are the same as the Schottky diode 100 disclosed above.

In a method for making the Schottky diode 200 according to one embodiment, the second metal layer 204b and the fourth metal layer 206b are formed on the insulating substrate 202 by a photolithography method. The first metal layer 204a and the third metal layer 206a are formed on the semiconductor structure 208 by photolithography method.

Figure 15:
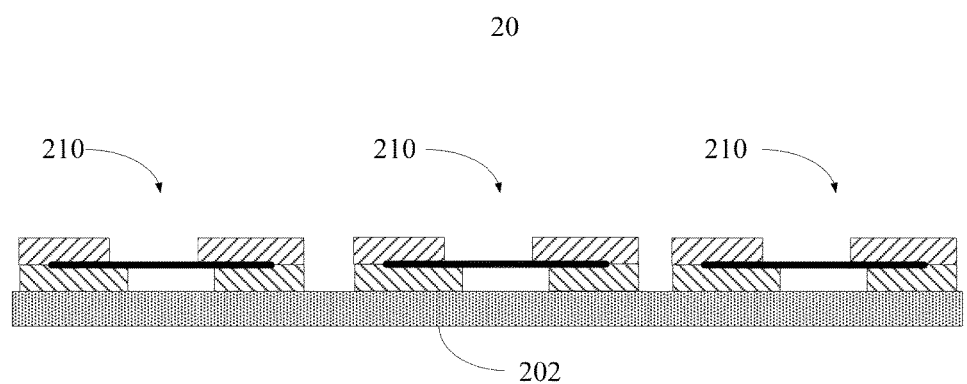
FIG. 15 is a structure schematic sectional view of one embodiment of a Schottky diode array.

Referring to FIG. 15, an embodiment of the present invention further provides a Schottky diode array 20. The Schottky diode array 20 includes an insulating substrate 202 and a plurality of Schottky diode units 210. The plurality of Schottky diode units 210 are uniformly distributed on a surface of the insulating substrate 202. Characteristics of the Schottky diode unit 210 are the same as the Schottky diode 200 disclosed above.

Figure 16:
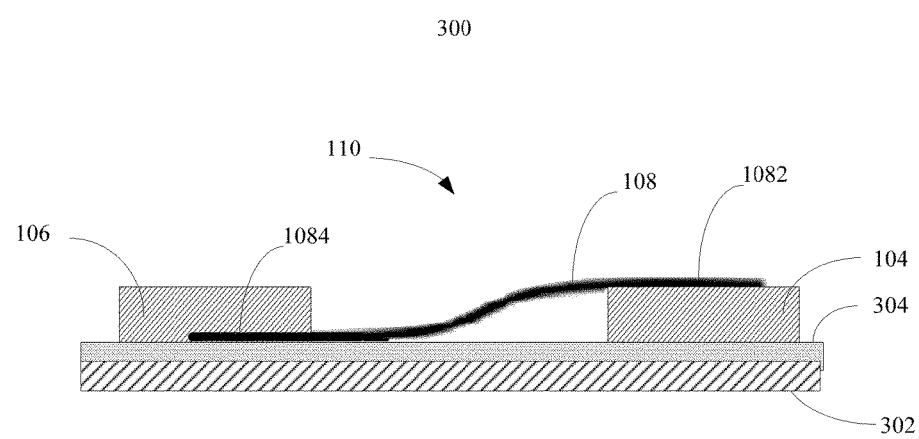
FIG. 16 a structure schematic side view of a third embodiment of a thin film transistor.

Referring to FIG. 16, a third embodiment of the present invention provides a thin film transistor 300. The thin film transistor 300 includes a gate electrode 302, an insulating medium layer 304 and at least one Schottky diode unit 110. The thin film transistor 300 can include one or more than one Schottky diode units 110. The insulating medium layer 304 is located on a surface of the gate electrode 302. The at least one Schottky diode unit 110 is located on a surface of the insulating medium layer 304. The at least one Schottky diode unit 110 is insulated from the gate electrode 302 via the insulating medium layer 304.

The gate electrode 302 is a conductive film. The conductive film has a thickness ranged from 0.5 nm to 100 μm. A material of the conductive film may be metal, alloy, doped semiconductor (such as silicon), indium tin oxide (ITO), antimony tin oxide (ATO), conductive silver paste, conductive polymer or conductive carbon nanotube. The metal or alloy material may be aluminum, copper, tungsten, molybdenum, gold, titanium, neodymium, palladium, cesium, or any alloy thereof. In this embodiment, the gate electrode 302 is a metal palladium film and has a thickness of 50 nm.

The insulating medium layer 304 functions as a support and an insulator. A material of the insulating medium layer 304 is hard materials or flexible materials. The hard materials can be glass, quartz, ceramics, diamond, or oxide. The flexible materials can be plastics or resins. In this embodiment, the material of the insulating medium layer 304 is an ALD-grown aluminum oxide film with a thickness of 20 nanometers.

The thin film transistor 300 can include a plurality of Schottky diode units 110. The insulating medium layer 304 can be a substrate with a large-scale integrated circuit, and the plurality of Schottky diode units 110 are integrated on the insulating medium layer 304 according to a predetermined rule or pattern, to form a thin film transistor panel or other thin film transistor semiconductor device. A shape of the insulating medium layer 304 is not limited, and can be a planar structure. The Schottky diode unit 110 is disposed on a surface of the insulating medium layer 304. The insulating medium layer 304 may also be a substrate having a grooved structure, the first electrode and the second electrode of the Schottky diode unit 110 are embedded inside the insulating medium layer 304 so that the surfaces of the first electrode 104, the second electrode 106 and the insulating dielectric layer 304 are in a same plane.

Other characteristics of the Schottky diode unit 110 are the same as the Schottky diode 100 disclosed above.

Figure 17:
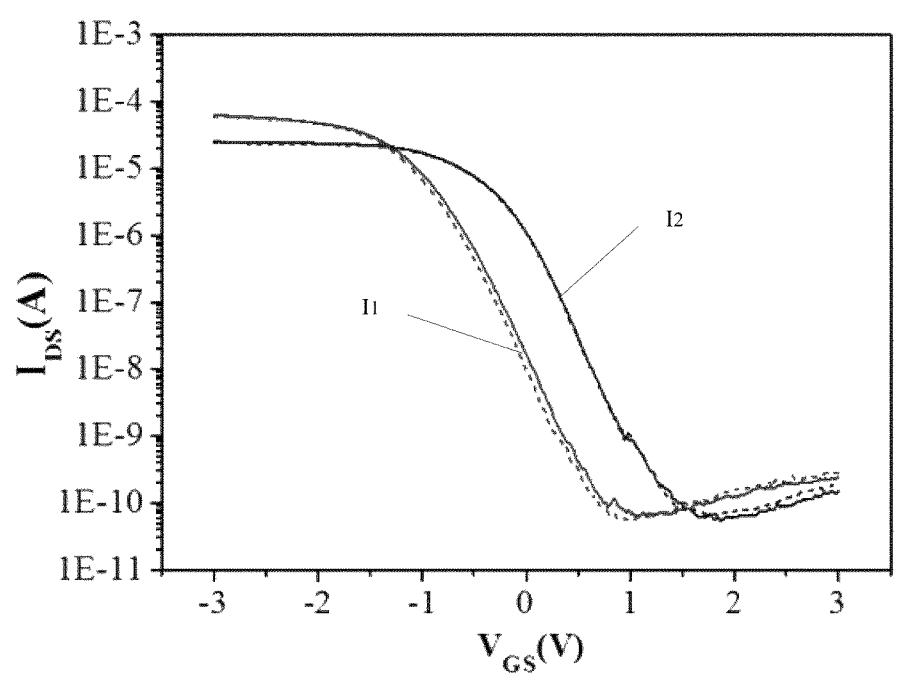
FIG. 17 is a transfer characteristic diagram of a thin film transistor according to one embodiment.

In one embodiment, a P-type carbon nanotube material is employed as the semiconductor structure 108. When a voltage of −1 V is applied to the first electrode 104, and the gate 302 is scanned with different voltage, a graph of current and voltage obtained is shown as $I_1$ in FIG. 17; when a voltage of −1 volt is applied to the second electrode 106, and the gate 302 is scanned with different voltage, a graph of current and voltage obtained is shown as $I_2$ in FIG. 17. It can be seen from FIG. 17 that when the thin film transistor 300 is in ON-state, the current flowing from the first electrode 104 located above the semiconductor structure 108 to the second electrode 106 located below the semiconductor structure 108 is greater than the current flowing from the second electrode 106 located below the semiconductor structure 108 to the first electrode 104 located above the semiconductor structure 108, that is, $I_1$ is greater than $I_2$.

In other embodiments, the thin film transistor 300 includes a plurality of Schottky diode units 110, and the plurality of Schottky diode units 110 are separated from each other and located on the surface of the insulating medium layer 304.

Figure 18:
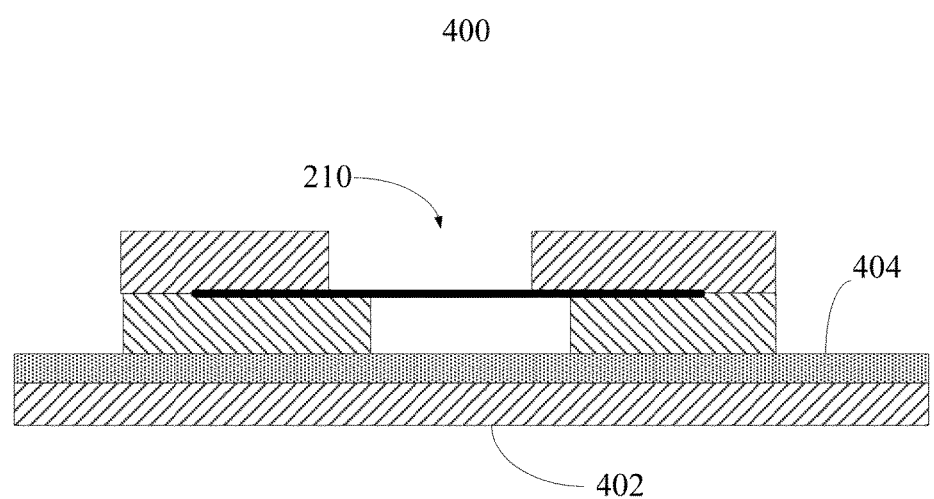
FIG. 18 is a structure schematic side view of a fourth embodiment of a thin film transistor.

Referring to FIG. 18, a fourth embodiment of the present invention provides a thin film transistor 400. The thin film transistor 400 includes a gate electrode 402, an insulating medium layer 404, and at least one Schottky diode unit 210. The thin film transistor 400 may include one or more Schottky diode units 210. The gate electrode 402 is the same as the gate electrode 302 disclosed in the third embodiment. The insulating medium layer 404 is the same as the insulating medium layer 304 disclosed in the third embodiment. The Schottky diode unit 210 is the same as the Schottky diode unit 210 disclosed in the second embodiment.

The insulating medium layer 404 may be a planar plate structure, and the Schottky diode unit 210 is disposed on a surface of the insulating medium layer 404. The insulating medium layer 404 may also be a substrate with groove structures. In the Schottky diode unit 210, the second metal layer 204b of the first electrode 204 and the fourth metal layer 206b of the second electrode 206 are embedded in the insulating medium layer 404, so that the surfaces of the second metal layer 204b, the fourth metal layer 206b and the insulating dielectric layer 404 are in a same plane.

In one embodiment, a P-type carbon nanotube material is used as the semiconductor structure 108. When the thin film transistor 300 is in on-state, the current flowing from the first electrode 104 located above the semiconductor structure 108 to a position below the semiconductor structure 108 is greater than the current flowing from the second electrode 106 located below the semiconductor structure 108 to the first electrode 104 above the semiconductor structure 108.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A Schottky diode comprising:
an insulating substrate and at least one Schottky diode unit, the at least one Schottky diode unit being located on a surface of the insulating substrate, wherein each of the at least one Schottky diode unit comprises:
a first electrode located on the surface of the insulating substrate, wherein the surface of the insulating substrate comprises groove structure, the first electrode is located in the groove structure, an upper surface of the first electrode is flush with the surface of the insulating substrate, and the semiconductor structure is horizontally disposed on the surface of the insulating substrate;
a semiconductor structure comprising a first end and a second end opposite with the first end, the first end is laid on a surface of the first electrode away from the insulating substrate, and the first electrode is located between the first end of the semiconductor structure and the surface of the insulating substrate, the second end of the semiconductor structure is located on the surface of the insulating substrate, the semiconductor structure is a nano-scale semiconductor structure; and
a second electrode located on the second end of the semiconductor structure, and the second end of the semiconductor structure is located between the second electrode and the surface of the insulating substrate.

2. The Schottky diode of claim 1, wherein the nano-scale semiconductor structure is a one-dimensional nano-structure with a diameter less than 200 nanometers.

3. The Schottky diode of claim 2, wherein the one-dimensional nano-structure comprises nanowire, nanotube and nanorod.

4. The Schottky diode of claim 1, wherein the nano-scale semiconductor structure is a two-dimensional nano-structure with a thickness less than 200 nanometers.

5. The Schottky diode of claim 4, wherein the two-dimensional nano-structure is a carbon nanotube film or molybdenum disulfide film.

6. The Schottky diode of claim 1, wherein a material of the semiconductor structure is a transition metal sulfide material.

7. The Schottky diode of claim 6, wherein the material of the semiconductor structure is molybdenum sulfide ($MoS_2$).

8. The Schottky diode of claim 7, wherein the molybdenum sulfide is an N-type semiconductor material and has a thickness ranged from 1 nanometer to 2 nanometers.

9. The Schottky diode of claim 1, wherein the semiconductor structure is an N-type semiconductor or a P-type semiconductor.

10. The Schottky diode of claim 1, wherein a material of the semiconductor structure is gallium arsenide, silicon carbide, polysilicon, monocrystalline silicon or naphthalene.

11. The Schottky diode of claim 1, wherein the at least one Schottky diode unit comprises a plurality of Schottky diode units, the plurality of Schottky diode units are arranged in an array and separated from each other.

* * * * *